United States Patent [19]

King

[11] Patent Number: 5,684,408

[45] Date of Patent: Nov. 4, 1997

[54] PROTECTIVE GROUNDING JUMPER CABLE TESTING METHOD

[75] Inventor: Clayton C. King, Centralia, Mo.

[73] Assignee: Hubbell Incorporated, Orange, Conn.

[21] Appl. No.: 769,167

[22] Filed: Dec. 18, 1996

Related U.S. Application Data

[62] Division of Ser. No. 437,661, May 9, 1995, Pat. No. 5,631,570.

[51] Int. Cl.$^6$ .............................. G01R 27/08; G01R 31/08
[52] U.S. Cl. .......................... 324/718; 324/523; 324/525; 324/713
[58] Field of Search ...................................... 324/522, 523, 324/525, 527, 539, 543, 691, 713, 714, 718, 722, 723, 133; 379/21, 22, 26, 30

[56] References Cited

U.S. PATENT DOCUMENTS

| | | | |
|---|---|---|---|
| 2,360,523 | 10/1944 | Simmons | 324/713 |
| 2,459,081 | 1/1949 | Kunz | 324/713 |
| 2,492,459 | 12/1949 | Bondurant | 324/713 |
| 2,510,691 | 6/1950 | Gilbert | 324/713 |
| 2,515,736 | 7/1950 | Saville et al. | 324/713 |
| 2,569,098 | 9/1951 | Hendricks et al. | 324/713 |
| 2,615,076 | 10/1952 | Miller | 324/525 |
| 2,862,179 | 11/1958 | Murphy | 324/525 |
| 3,772,593 | 11/1973 | Sidhu | 324/713 |
| 3,816,812 | 6/1974 | Alber et al. | 324/712 |
| 3,870,836 | 3/1975 | Kusama | 379/21 |
| 4,088,949 | 5/1978 | Goldish et al. | 324/713 |
| 4,399,402 | 8/1983 | Pelletier | 324/525 |
| 4,400,663 | 8/1983 | May | 324/525 |
| 4,408,157 | 10/1983 | Beaubien | 324/712 |
| 5,101,161 | 3/1992 | Walsh et al. | 324/543 |
| 5,508,621 | 4/1996 | Wong | 324/713 |

OTHER PUBLICATIONS

Inspec, Patents Associates Literature, Anderson et al, Journal of Physics vol. 8, No. 5 pp. 398–402, May 1975.

Primary Examiner—Ernest F. Karlsen
Assistant Examiner—Diep Do
Attorney, Agent, or Firm—Jerry M. Presson; Michael R. Swartz

[57] ABSTRACT

A protective grounding jumper cable tester basically includes a housing, a direct current power supply, a pair of jumper attachment terminals, a pair of test probe terminals, a current applying circuit connected between the direct current power supply and the pair of jumper attachment terminals for applying a direct current through a jumper cable attached between the jumper attachment terminals, and a resistance sensing circuit connected to the test probe terminals for sensing resistance to the flow of the direct current through the jumper cable by using a pair of test probes connected to the test probe terminals. A protective grounding jumper cable testing method includes connecting a jumper cable that is to be tested between a pair of terminals, applying a direct current to the cable, observing a current sensing meter while adjusting the direct current flowing through the jumper cable, either continuing with testing of the jumper cable if the direct current can be adjusted to a first preselected quantity, retest the jumper cable after inspecting and maintaining it or reject the jumper cable, setting a resistance sensing meter to sense resistance within a first preselected test range, contacting a pair of test probes to the terminals to indicate the resistance of the jumper cable to the direct current, comparing the resistance indicated by the resistance sensing meter with the first preselected test range, and, based on the comparison, either accept the jumper cable, retest the jumper cable after inspecting and maintaining it or reject the jumper cable.

15 Claims, 9 Drawing Sheets

PROTECTIVE GROUNDING JUMPER CABLE TESTING METHOD

This is a Division of application Ser. No. 08/437,661, filed May 9, 1995 Pat. No. 5,631,570.

BACKGROUND OF THE INVENTION

1. Field of the Invention

The present invention generally relates to testing of grounding jumper cables and, more particularly, is concerned with a grounding jumper cable tester and testing method for determining if the resistance of a grounding jumper cable to current flow is below a predetermined safe level.

2. Description of the Prior Art

During maintenance of a power line, it may become accidentally energized due to the inadvertent closing of a breaker or switch or due to mutual induction from parallel live lines. To protect workers from electric shock should a fault occur, grounding jumper cables are installed in various configurations to form a jumper system. Grounding jumper cables are conductive cables that have attachment means, such as clamps, at either end. The jumper system provides a path for current to flow around the worker to a neutral line or to the earth. However, in order for the jumper system to adequately protect the worker, it must provide a very low resistance path to current flow so that the voltage drop across the worker is maintained within a safe level should a fault occur.

The maximum allowable resistance of the jumper system can be determined based upon assumptions concerning the available fault current at the work site, the duration of the available fault current, and the level of safety to be provided. Once the maximum allowable jumper system resistance is determined, individual grounding jumper cables can be selected to form the jumper system. Since the resistance of the jumper system is determined primarily by the resistance of each of the individual jumper cables, it is necessary to determine the resistance of the individual jumper cables. Additionally, since they may be damaged during storage, transport or use, individual jumper cables should be periodically tested to ensure that their resistance remains suitable for the desired level of protection.

Grounding jumper cable tester devices exist, such as the one manufactured by Hasting's Fiberglass Corporation, that are designed to test the resistance of a jumper cable to current flow. The devices test the resistance of a jumper cable by relying on Ohm's law which defines the mathematical relationship between voltage, current and resistance. A known current is applied through the cable and the voltage drop across the cable is measured. With the current and voltage known, the resistance can be determined. However, the prior art jumper cable testing device identified above utilizes a current transformer to provide an alternating test current. This presents two significant drawbacks.

The first drawback is the inductance associated with alternating current. When alternating current flows through the jumper cable, inductance can function similar to resistance and cause a voltage drop. Such an induced voltage drop may result in an inaccurately high resistance determination. The effect of inductance is particularly acute if the cable is coiled or on a conductive surface. Thus, when using an alternating test current, it is critical to take steps to ensure that the jumper cable is positioned properly to minimize the possible effect of inductance.

The second drawback is the low testing voltage. Many jumper cables have aluminum clamps. A thin aluminum oxide coating forms on the clamps. This coating is highly resistant to current flow but easily breaks down when a sufficient voltage level, in the range of 5 to 10 volts, is applied. The voltage levels encountered at work sites are more than sufficient to break down any aluminum oxide coating on the clamps making the resistance of the coating irrelevant. However, if sufficient voltage is not applied during testing, the thin aluminum oxide coating can raise the resistance of the jumper cable and result in the unnecessary rejection of the jumper cable. While the current transformer used in the prior known devices provides a sufficiently high alternating test current, it does so at the expense of voltage. The voltage drop created by prior alternating current jumper cable test devices is often inadequate to break down the aluminum oxide coating resulting in an inaccurate resistance determination and unnecessary rejection of the jumper cable.

Consequently, a need still exists for a grounding jumper cable testing device and testing method that avoids the problem of inductance associated with alternating current and provides a sufficient voltage drop to break down any aluminum oxide coating on the clamps of the cable.

SUMMARY OF THE INVENTION

The present invention provides a protective grounding cable tester and testing method designed to satisfy the aforementioned needs by avoiding the drawbacks of the prior art without introducing other drawbacks. Accordingly, the present invention is directed to a protective grounding jumper cable tester and testing method for determining whether a grounding jumper cable has an adequately low resistance to current flow so that it may be safely used in a jumper system.

The protective grounding jumper cable tester of the present invention basically includes: (a) a housing, which may be portable for field use of the tester; (b) a pair of jumper attachment terminals on the housing; (c) a pair of test probe terminals on the housing; (d) a current applying circuit disposed in the housing and connected to the pair of jumper attachment terminals for applying a direct current through a jumper cable attached between the jumper attachment terminals; and (f) a resistance sensing circuit disposed in the housing and connected to the test probe terminals for sensing resistance to the flow of the direct current through the jumper cable by using a pair of test probes connected to the test probe terminals. Further, the tester includes a power supply disposed in the housing and connected to the current applying circuit for producing the direct current flow therein and through the jumper cable.

One feature of the protective grounding jumper cable tester of the present invention is that it relies on direct current rather than alternating current for testing the resistance of a grounding jumper cable to current flow. This avoids the problem of inductance associated with alternating current making irrelevant the positioning the jumper cable during testing.

Another feature of the protective grounding jumper cable tester of the present invention is that it more accurately determines the resistance of a jumper cable having aluminum clamps. The thin aluminum oxide coating that forms on the outside of aluminum clamps is highly resistant to current flow, but the direct current power supply of the tester provides a sufficient voltage drop to break down the thin aluminum oxide coating that forms on the outside of the aluminum clamps so that it does not affect the resistance of the jumper cable during testing.

The protective grounding jumper cable testing method of the present invention begins with connecting a jumper cable to be tested between a pair of jumper attachment terminals and applying a direct current to the jumper attachment terminals so that a direct current flows through the jumper cable. Next, a meter connected across the terminals for sensing and indicating the quantity of the direct current flowing through the jumper cable is observed while the direct current flowing through the jumper cable is adjusted. If the direct current cannot be adjusted to a first preselected quantity, then the jumper cable is either retested after being inspected and maintained (that is, cleaned and tightened or re-crimped) or it is rejected. If the direct current can be adjusted to the first preselected quantity, then testing of the cable is continued as set forth below. A resistance sensing meter is set to sense resistance within a first preselected test range and the jumper attachment terminals are contacted by a pair of test probes connected to the resistance sensing meter so as to sense and indicate on the resistance sensing meter the resistance to the flow of the direct current through the jumper cable. The resistance indicated by the resistance sensing meter is compared with the first preselected test range and the jumper cable is either accepted, retested after being inspected and maintained, or rejected. The jumper cable is accepted if the indicated resistance is below a predetermined safe resistance level. If the resistance exceeds a predetermined safe level, the jumper cable is inspected, maintained and retested. If, during retesting, the resistance exceeds a predetermined safe level again, then the cable is rejected.

In the event that the resistance indicated by the resistance sensing meter is below the preselected test range, the method further comprises the additional steps of applying second and third preselected direct currents through the jumper cable that are greater than the first preselected direct current and setting the resistance sensing meter to sense resistances within second and third preselected test ranges which are progressively lower than the first preselected test range. The resistance of the jumper cable to the higher direct currents is indicated and compared successively with the respective second and third preselected test ranges, with such comparisons resulting in the cable either being accepted, retested or rejected as before.

One feature of the testing method of the present invention is that it involves the application of a direct current through the jumper cable being tested rather than an alternating test current. This avoids the problem of inductance and eliminates the need for an additional step to minimize the possible effect of inductance during testing.

Another feature of the testing method of the present invention is the utilization of multiple preselected test ranges of resistance. This feature increases the reliability and accuracy of the testing method.

These and other features and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

In the following detailed description, reference will be made to the attached drawings in which.

DETAILED DESCRIPTION OF THE INVENTION

Referring to the drawings, and particularly to FIGS. 1–4, there is illustrated a protective grounding jumper cable tester of the present invention, being generally designated 10. The tester 10 includes a housing 12 which preferably, although not necessarily, is portable for readily accommodating field use of the tester. The tester 10 also has a cover 14 attached to the housing 12 by a pair of hinges 16 for pivotally closing the cover 14 during periods of non-use and opening the cover 14 to gain access to the components therein, which are described below, for using the tester 10.

The tester 10 also includes a power supply (PS) 18 which is disposed within the housing 12 below the top panel 12A thereof. The power supply 18 receives alternating current and converts it into direct current. Mounted on the top panel 12A of its housing 12, the tester 10 further has a power receptacle 20 adapted to receive a plug 22 of a power cord (not shown) to connect the power supply 18 to a source of the alternating current, such as a conventional sixty-cycle utility power receptacle, a power switch 24 operable for turning the tester 10 on and off, a fuse 26 for protecting the circuitry of the tester 10, and an indicator light 28 which is lit when the tester 10 is on. Also, a fan (F) 30 is disposed within the housing 12 to help circulate air within the housing 12 and dissipate heat generated by the power supply 18 and the other components of the tester 10. The power supply 18, power receptacle 20, switch 24, fuse 26, indicator light 28 and fan 30 are interconnected as shown in the circuit diagram of FIG. 3. When the tester 10 is switched "on" by actuation of the power switch 24, the direct current (d.c.) power supply 18 preferably supplies an output of five volts and up to twenty-five amps of direct current to the various components of the tester 10 described above and to the various circuits of the tester 10 described below.

Figure 6:
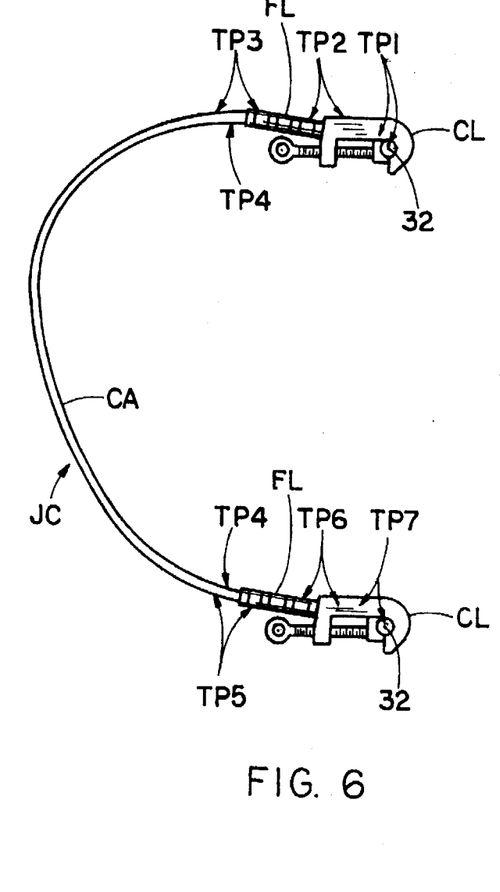
FIG. 6 is a perspective view of a protective grounding jumper cable that may be tested according to the testing method of the present invention.

The tester 10 further includes a pair of jumper attachment terminals 32 mounted at the front corners of the housing 12 for attachment therebetween of a jumper cable JC (see FIG.

6) to be tested and a pair of test probe terminals 34 spaced between and rearwardly of the jumper attachment terminals 32 for connection of a pair of test probes 36 (see FIG. 4) thereto. As shown in greater detail in FIG. 5, each of the jumper attachment terminals 32 preferably includes an internally threaded connection block 32A mounted in any suitable manner in one of the front corners of the housing 12 and an externally threaded removable terminal clamp attachment extension post 32B which threads into and from the connection block 32A to respectively deploy the post 32B for use and remove the post 32B for storage in the housing. Posts 32B having different sizes and shapes may be provided for facilitating the attachment of jumper cables JC having clamps CL of different sizes and shapes.

Figure 1:
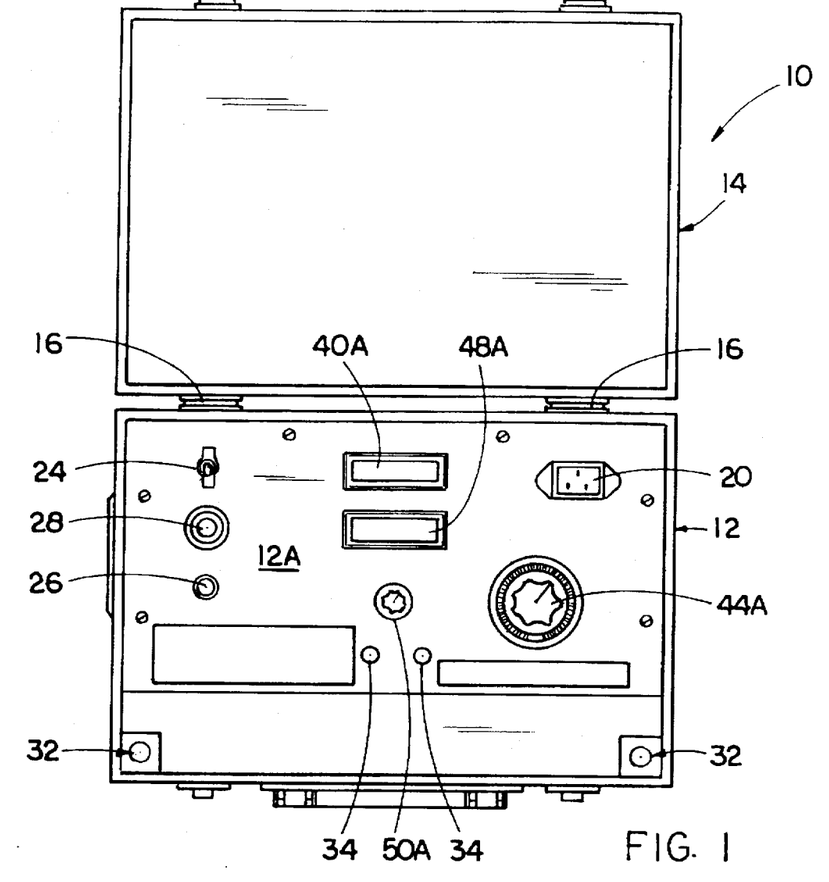
FIG. 1 is a top plan view of a protective grounding jumper cable tester of the present invention.
Figure 2:
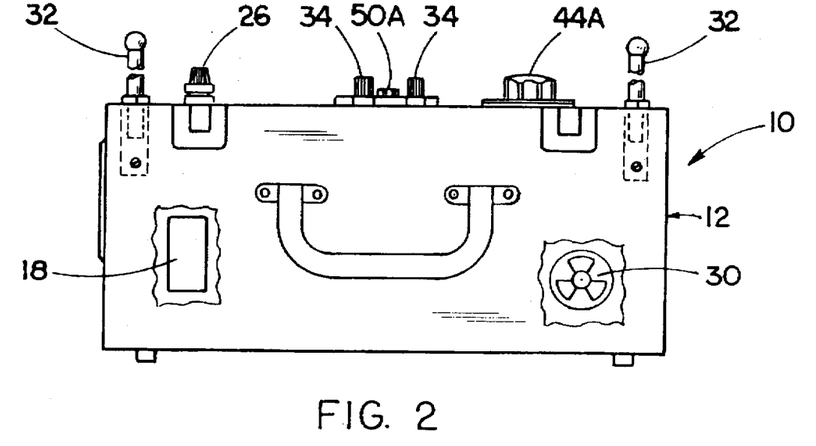
FIG. 2 is a front elevational view of the tester.
Figure 3:
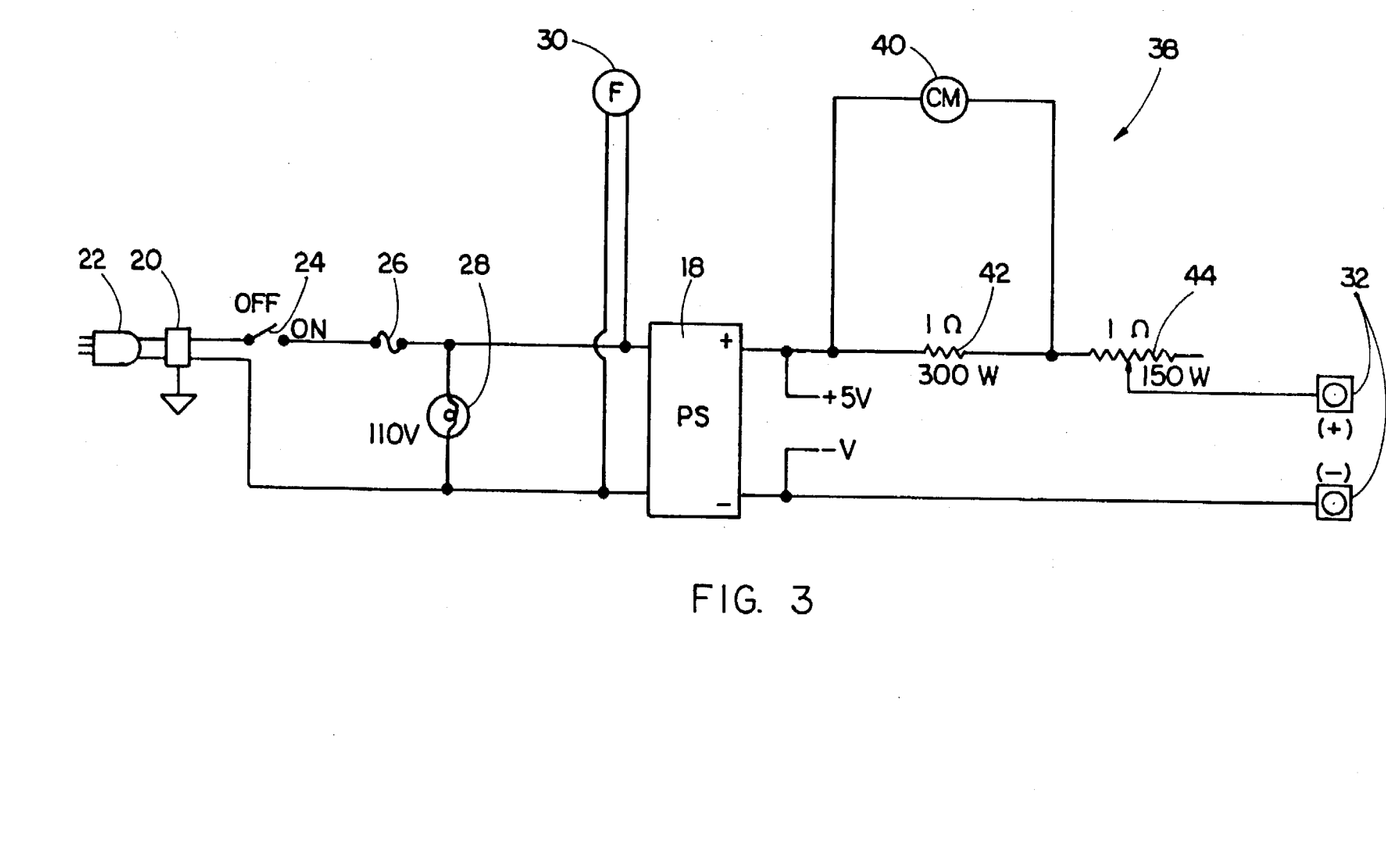
FIG. 3 is schematic diagram of a current applying circuit of the tester.

Referring now to FIGS. 1 and 3, the tester 10 also includes a current applying circuit 38 disposed in the housing 12 and connected between the d.c. power supply 18 and the pair of jumper attachment terminals 32 for applying a direct current through the jumper cable JC attached between the jumper attachment terminals 32, as shown in FIG. 6. The current applying circuit 38 preferably includes a current sensing meter (CM) 40 connected in parallel with a current limiting resistor 42 and a variable resistor or rheostat 44 connected in series with each of them between the d.c. power supply 18 and one of the jumper attachment terminals 32. The current sensing meter 40 indicates on a readout or display 40A thereof mounted on the top panel 12A of the housing 12 the quantity of direct current applied through the jumper cable JC by the current applying circuit 38. By turning a knob 44A on the rheostat 44 disposed above the top panel 12A of the housing 12, the rheostat 44 is used to adjust the direct current applied through the jumper cable JC by the current applying circuit 38 to a preselected quantity, such as five amps.

Figure 4:
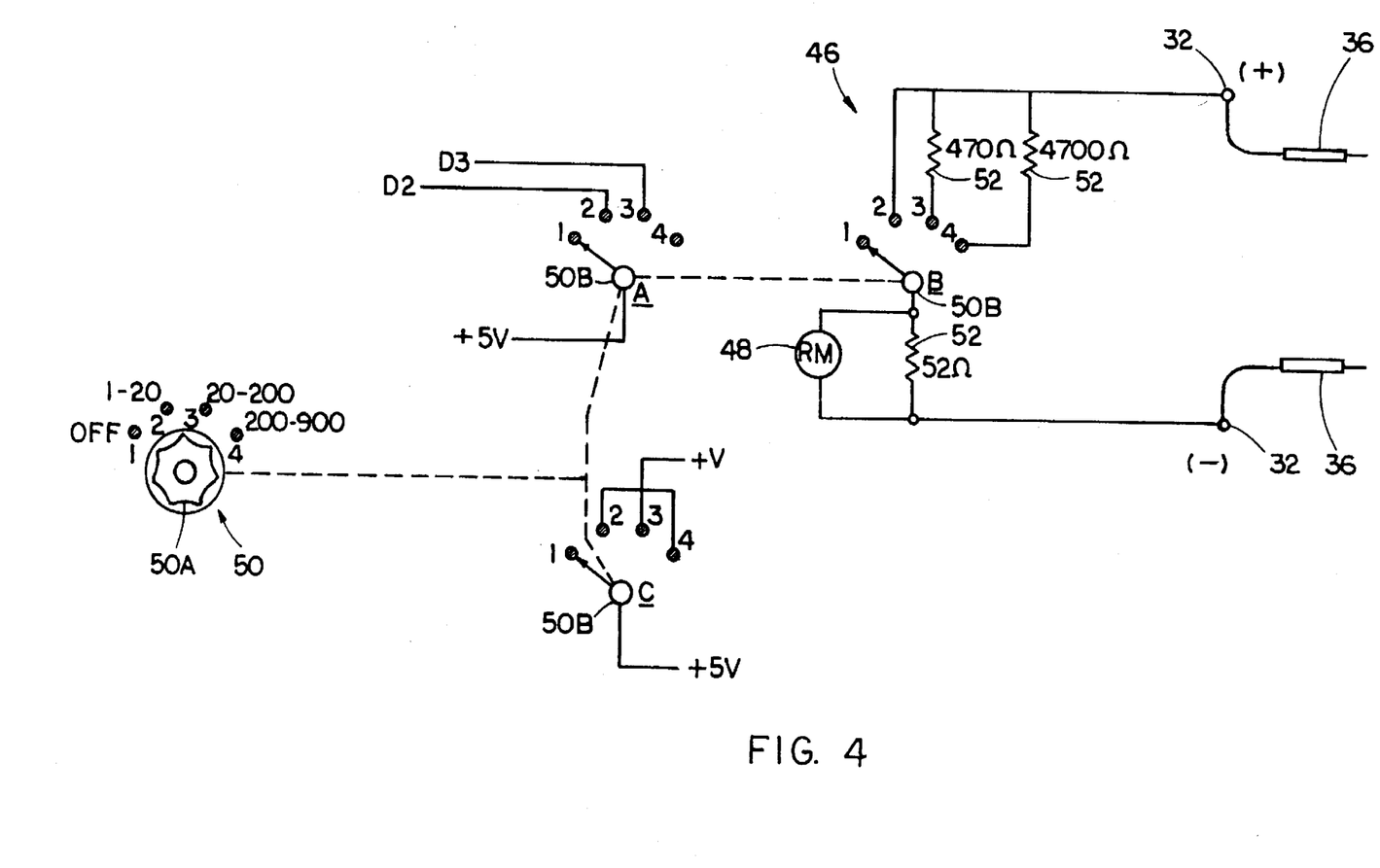
FIG. 4 is a schematic diagram of a resistance sensing circuit of the tester.
Figure 5:
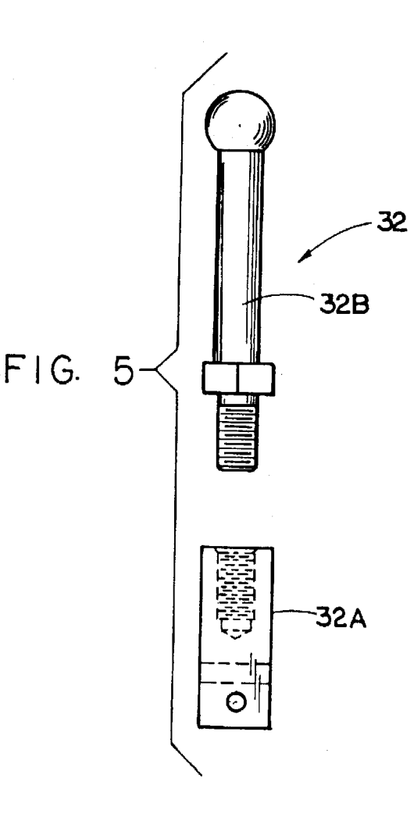
FIG. 5 is an exploded side elevational view of a removable post and a connection block of a jumper attachment terminal of the tester.

Referring now to FIGS. 1 and 4, the tester 10 further includes a resistance sensing circuit 46 disposed in the housing 12 and connected to the pair of test probe terminals 34 for sensing resistance of the jumper cable JC to the flow of the direct current applied therethrough by the current applying circuit 38. Preferably, the resistance sensing circuit 46 includes a resistance measuring meter (RM) 48 having a readout or display 48A mounted on the top panel 12A of the housing 12 which provides resistance readings in milliohms and a resistance measuring meter range selector switch 50 having a rotatable knob 50A disposed above the top panel 12A for turning to select a desired one of a plurality of predetermined resistance test ranges, for example, 1 to 20 milliohms, 20 to 200 milliohms and 200 to 900 milliohms. The pair of test probes 36 are connected to the test probe terminals 34. When the positive and negative test probes 36 are brought into contact with the respective positive and negative jumper attachment terminals 32, the resistance of the jumper cable JC to the flow of the direct current applied therethrough by the current applying circuit 38 is measured by the resistance measuring meter 48 and indicated on the resistance meter display 48A on the top panel 12A of the housing 12. The resistance range selector switch 44 may be used to select a particular one of the predetermined resistance test ranges so that the resistance measuring meter 48 may more accurately measure the resistance of the jumper cable JC. The resistance sensing circuit 46 also includes scaling resistors 52 which allow the resistance measuring meter 48 to be interpreted directly in milliohms of resistance instead of volts. The rotary resistance range selector switch 50 provides the full scale ranges of resistance that can be read. The contact arm 50B has three different portions shown diagrammatically and identified as A, B and C in FIG. 4 which are rotated by rotation of the knob 50A of the switch 50 also shown in FIG. 4. The portions of the contact arm 50B and knob 50A can be rotated between four possible positions labeled as 1, 2, 3 and 4 in FIG. 4. The positions of the portion A of the contact arm 50B determines the location of the decimal point (D2, D3) on the display 48A of the resistance measuring meter 48. The portion B of the contact arm 50B is associated with the resistance sensing circuit 46 and its various positions change the scaling of the resistance measuring meter 48. All of the positions of the portion C of the contact arm 50B provides direct current voltage from the power supply 18 to the various components of the tester 10.

Figure 8:
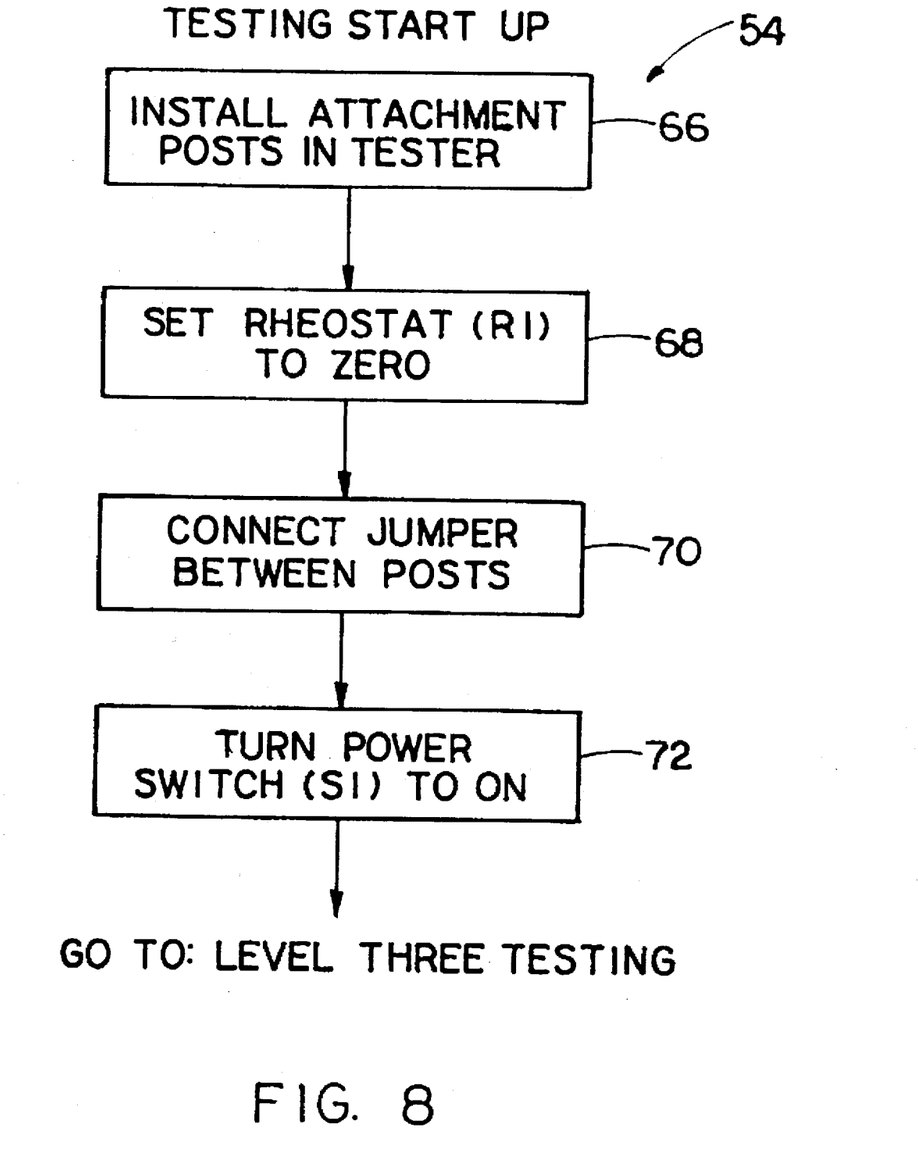
FIG. 8 is a flow chart showing the steps of an Initial Testing Start-Up procedure of the protective grounding jumper cable testing method of the present invention.
Figure 9:
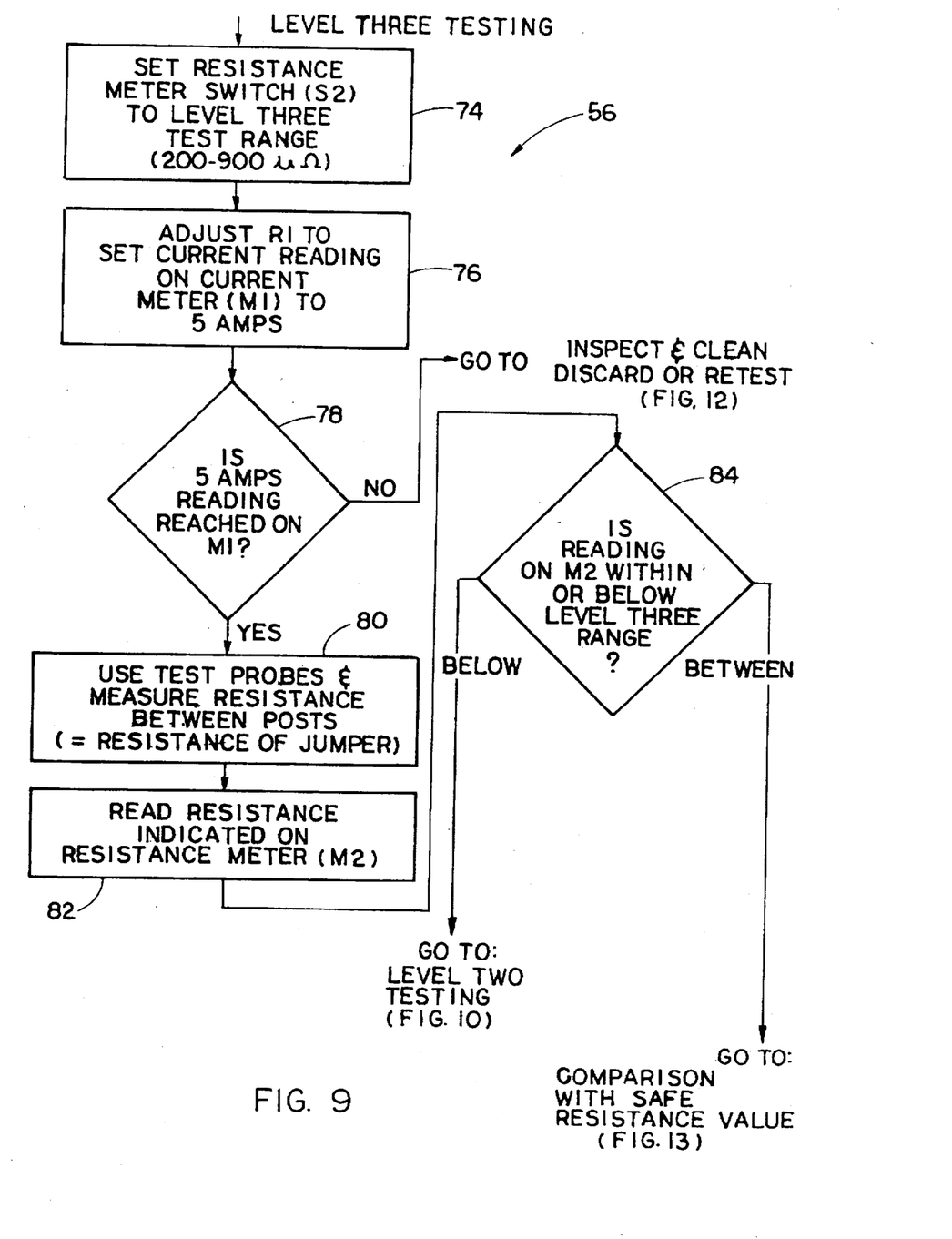
FIG. 9 is a flow chart showing the steps of a Level Three Testing procedure of the testing method.
Figure 10:
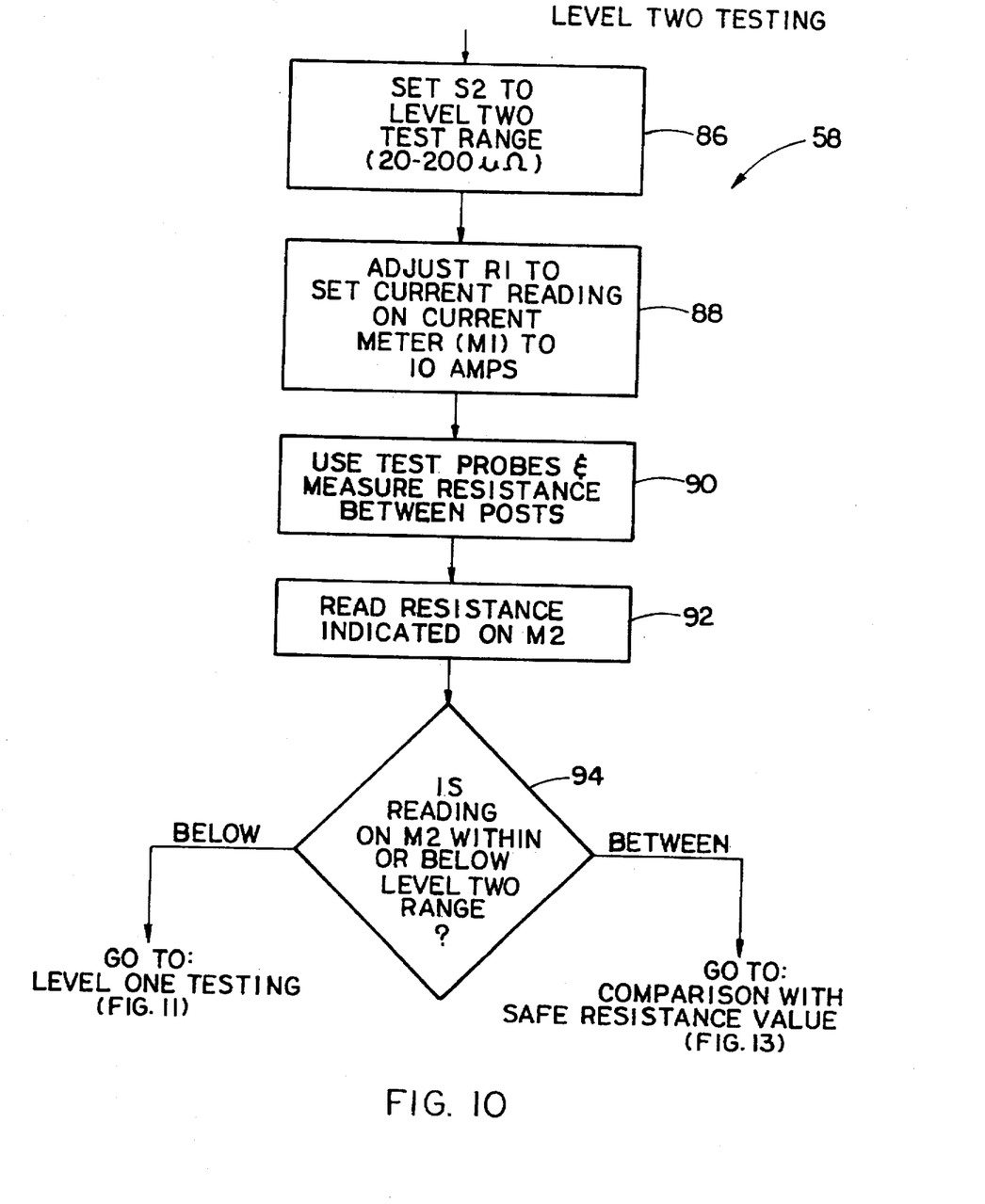
FIG. 10 is a flow chart showing the steps of a Level Two Testing procedure of the testing method.
Figure 11:
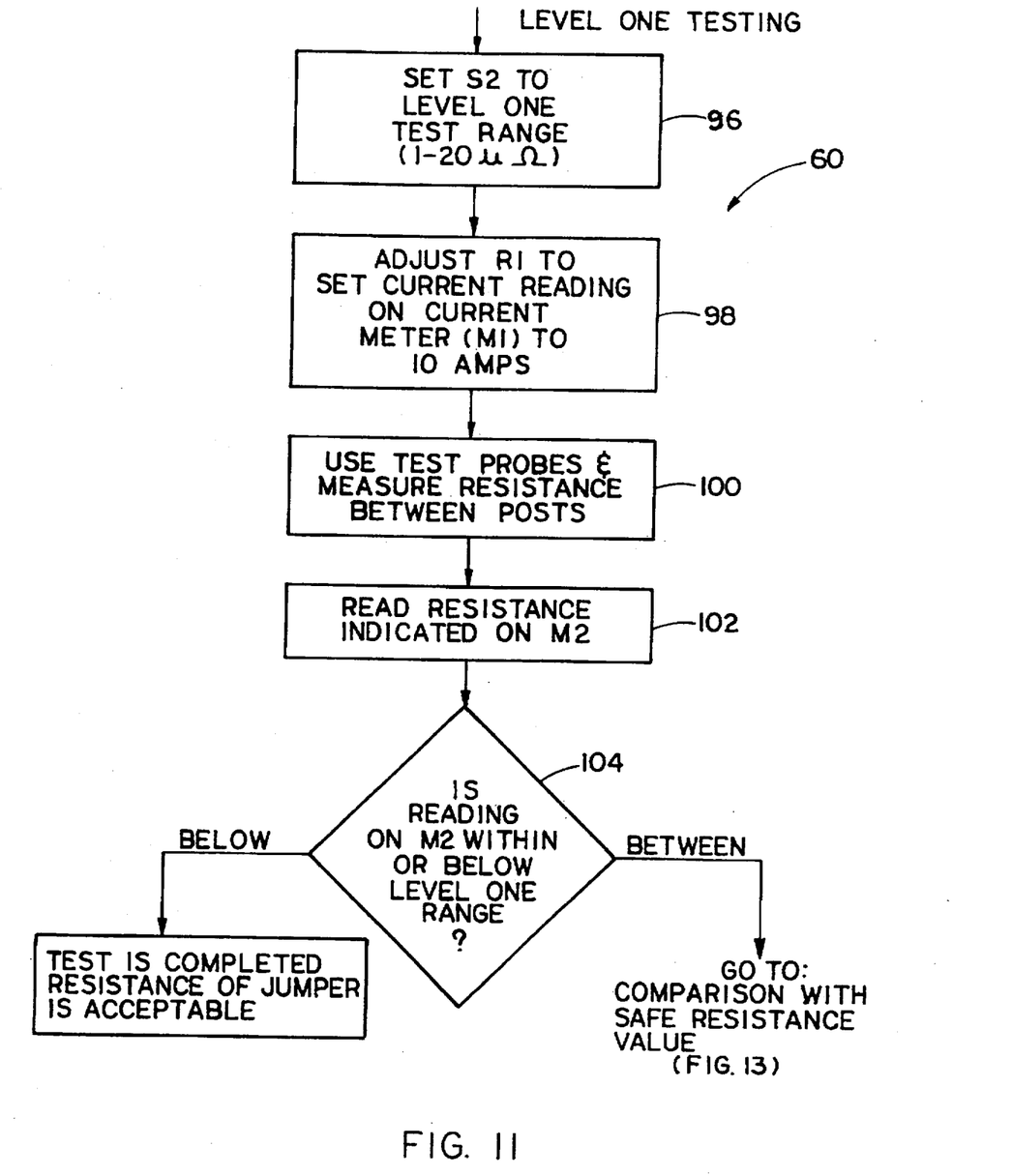
FIG. 11 is a flow chart showing the steps of a Level One Testing procedure of the testing method.
Figure 12:
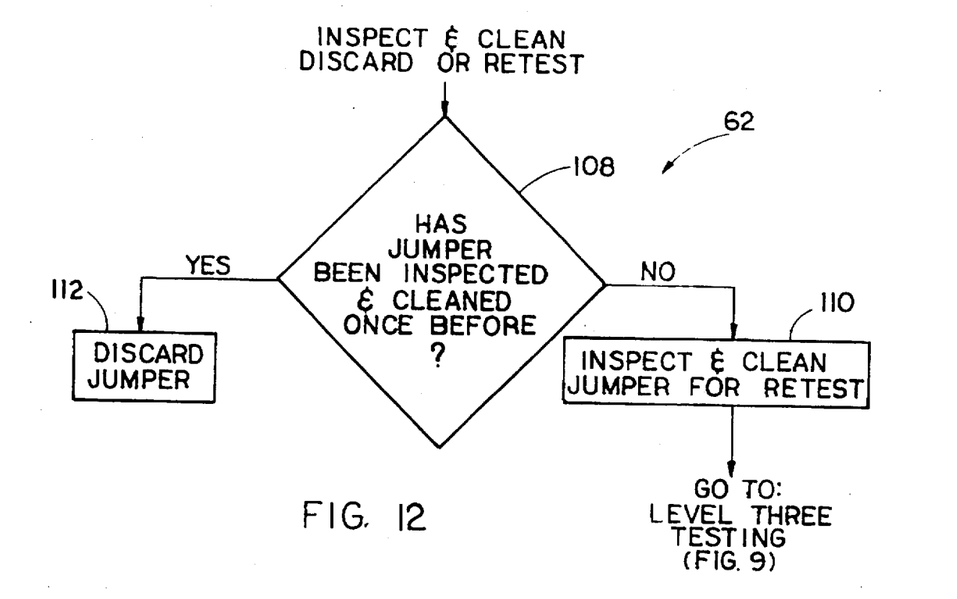
FIG. 12 is a flow chart showing the steps of an Inspect And Clean, then Discard or Retest procedure of the testing method.
Figure 13:
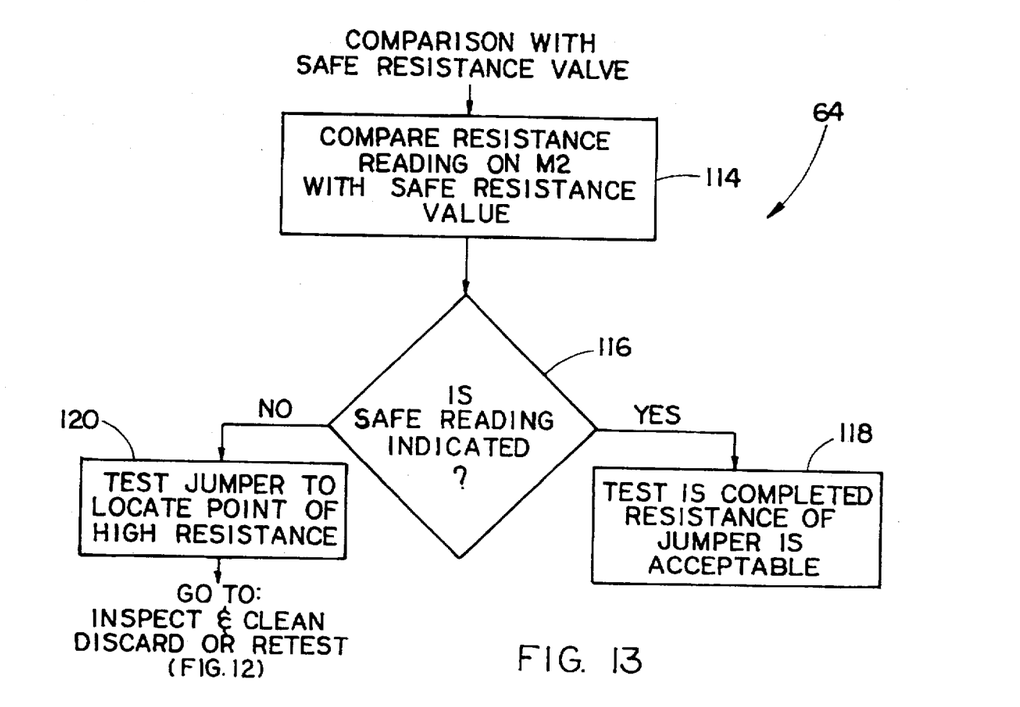
FIG. 13 is a flow chart showing the steps of a Comparison With Safe Resistance Value procedure of the testing method.

The preferred jumper cable testing method of the present invention is illustrated by the flow charts 54, 56, 58, 60, 62 and 64 of FIGS. 8 through 13, respectively. The testing method is most effectively performed by utilizing the tester 10 of the present invention. More particularly, the flow chart 54 of FIG. 8 shows the steps of an Initial Testing Start-up procedure of the testing method. The flow chart 56 of FIG. 9 illustrates the steps of a Level Three Testing procedure of the testing method. The flow chart 58 of FIG. 10 depicts the steps of a Level Two Testing procedure of the testing method. The flow chart 60 of FIG. 11 shows the steps of a Level One Testing procedure of the testing method. The flow chart 62 of FIG. 12 depicts the steps of an Inspect and Clean, then Discard or Retest procedure of the testing method. Finally, the flow chart 64 of FIG. 13 depicts the steps of a Comparison With Safe Resistance Value procedure of the testing method.

Referring now to the flow chart 54 of FIG. 8, the Initial Testing Start-Up procedure of the testing method begins, as per block 66, with setting up the tester 10 and installing the terminal clamp attachment extension posts 32B into the connection blocks 32A. Next, as per block 68, the rheostat 44 is adjusted to zero so that the current applying circuit 38 applies minimal current when the tester 10 is switched on. Then, as per block 70, the jumper cable JC that is to be tested is connected between the posts 32B of the jumper attachment terminals 32, as shown in FIG. 6, and after doing so, as per block 72, the tester 10 is switched on to apply a direct current through the jumper cable JC.

Referring next to the flow chart 56 of FIG. 9, once the above-described initial steps are completed, the testing method continues with Level Three Testing procedure as indicated at the end of the flow chart 54 of FIG. 8. As per block 74, the resistance measuring meter range selector switch 50 is set to a first preselected test range, for example, by rotating the knob 50A to position 4 identified as 200–900 milliohms. Next, as per block 76, the direct current flowing through the jumper cable JC is adjusted while observing the current sensing meter 40. The direct current is adjusted by turning the rheostat knob 44A until the direct current indicated on the current sensing meter display 40A reaches a first preselected quantity, for example 5 amps. As per diamond 78, if the direct current cannot be adjusted to reach the first preselected quantity (the answer to the question in the diamond 78 is No), then the jumper cable JC is either retested after being inspected and maintained or it is rejected according to the steps shown in the flow chart 62 of FIG. 12 which are described below. Level three testing continues only if the current can be adjusted to the first preselected quantity (the answer to the question in the diamond 78 is Yes). If so, as per block 80, the test probes 36 are brought into contact with the posts 32B to sense and indicate the resistance of the jumper cable JC to the flow of the direct current therethrough on the resistance meter display 48A. As per block 82, the amount of resistance is read from the display 48A. As per diamond 84, this resistance reading is compared with the first preselected test range and, if it is within the first preselected test range (the answer to the question is diamond 84 is Between), then the jumper cable JC is either accepted, retested, or rejected in accordance with the steps shown in the flow chart 64 of FIG. 13 which are described below. If the indicated resistance is below the first preselected test range (the answer to the question in diamond 84 is Below), then it is necessary to proceed with the steps for level two testing as shown in the flow chart 58 of FIG. 10 which are described below.

Referring next to the flow chart 58 of FIG. 10, the Level Two Testing procedure of the testing method begins, as per block 86, with setting the resistance measuring meter range selector switch 50 to a second preselected test range which is below the first preselected test range, for example, by rotating the knob 50A to position 3 identified as 20–200 milliohms. The current is then adjusted, as per block 88, by further turning the rheostat knob 44A until it reaches a second preselected quantity which is greater than the first preselected quantity, for example, 10 amps. Once the current is adjusted to the second preselected quantity, as per block 90, the test probes 36 are brought into contact with the posts 32B to indicate the resistance of the jumper cable JC on the resistance meter display 48A. As per block 92, the amount of resistance is read from the display 48A. As per diamond 94, this second resistance reading is compared with the second preselected test range and, if it is within the second preselected test range (the answer to the question in diamond 94 is Between), then the jumper cable JC is either accepted, retested, or rejected in accordance with the steps of the procedure shown in the flow chart 64 of FIG. 13 which are described below. If the indicated resistance is below the second preselected test range (the answer to the question in diamond 94 is Below), then it is necessary to proceed with the steps for Level One Testing procedure as shown in the flow chart 60 of FIG. 11 which are described below.

Referring next to the flow chart 60 of FIG. 11, the Level One Testing procedure of the testing method begins, as per block 96, with setting the resistance measuring meter range selector switch 50 to a third preselected test range which is below the second preselected test range, for example, by rotating the knob 50A to position 2 identified as 1–20 milliohms. As per block 98, the current is then adjusted as before until it reaches a third preselected quantity which is substantially equal to the second preselected quantity, for example 10 amps. Once the current is adjusted to the third preselected quantity, as per block 100, the test probes 36 are brought into contact with the posts 32B to indicate the resistance of the jumper cable JC on the resistance meter display 48A. As per block 102, the amount of resistance is read from the display 48A. As per diamond 104, this third resistance reading is compared with the third preselected test range and, if it is within the third preselected test range (the answer to the question in diamond 104 is Between), then the jumper cable JC is either accepted, retested, or rejected in accordance with the steps of the flow chart 64 of FIG. 13 which are described below. If the indicated resistance is below the third preselected test range (the answer to the question in diamond 104 is Below), then testing of the jumper cable JC is completed and the resistance of the jumper cable is acceptable, as per block 106.

Referring now to FIG. 12, when the direct current through the jumper cable JC cannot be adjusted to the first preselected quantity during the Level Three Testing procedure it is necessary to perform the Inspect & Clean, Discard or Retest procedure of flow chart 62. This procedure involves first inspecting and maintaining (that is, cleaned and tightened or recrimped) the jumper cable JC, then retesting it according to the steps for the Level Three Testing procedure of the flow chart 56 of FIG. 9. Also, the steps shown in the flow chart 64 of FIG. 13 and set forth below may also call for inspection and maintenance of the cable before retesting it at the current testing level. Accordingly, as per diamond 108 of flow chart 62, if the jumper cable JC has not yet been inspected and maintained (answer to the question in diamond 108 is No), then the jumper cable is inspected for conditions which might affect its resistance, such as faulty connections, broken wires or excessively corroded clamps, and maintenance is performed to the jumper cable JC to remedy any such conditions, as per block 110. Once inspected and maintained, the jumper cable JC is retested according to the steps of the appropriate testing level. However, if the jumper cable JC has already been inspected and maintained (answer to the question in diamond 108 is Yes) and it is presently being retested then there is no need for further inspection and maintenance and the cable is rejected, as per block 112.

Referring finally to FIG. 13, when the indicated resistance of the jumper cable JC to the flow of the applied direct current therethrough is within either the first, second or third preselected test ranges, it is then necessary to compare the indicated resistance with a predetermined safe resistance value according to the Comparison With Safe Resistance Value procedure of flow chart 64. After the comparison is performed, as per block 114, if the indicated resistance is below the predetermined safe resistance value (the answer to the question in diamond 116 is Yes), then testing is completed and the jumper cable JC is accepted, as per block 118. If the indicated resistance exceeds the predetermined safe resistance value (the answer to the question in diamond 116 is No), then it may be necessary to test the jumper cable JC to locate the points of high resistance, as per block 120, by performing inspection and maintenance on the jumper cable JC and then retest it in accordance with the steps of the flow chart 62 of FIG. 12 which are described above.

Figure 7:
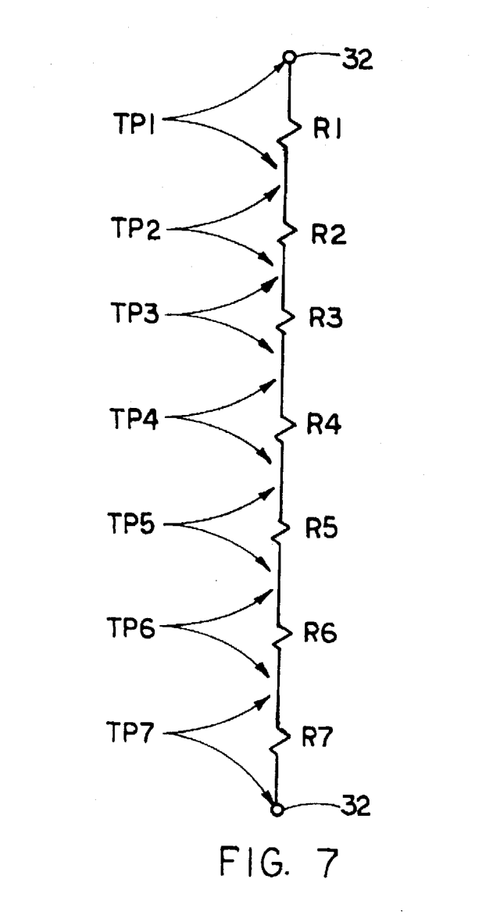
FIG. 7 is a schematic diagram of the electrical equivalent circuit of the jumper cable of FIG. 6.

Thus, before performing inspection of the cable in accordance with the steps of the flow chart 62 of FIG. 12, it is preferable to locate the portions of the jumper cable JC which are contributing to a high resistance reading. This may be accomplished by using the test probes 36 to make resistance readings of various portions of the jumper cable JC. As shown in FIG. 6, a typical jumper cable JC consists of a pair of clamps CL and a cable CA which extends between and interconnects the clamps CL. The cable CA is attached at either end to the clamps CL by a ferrule FL. When the jumper cable JC is attached between the jumper attachment terminals 32, it completes the current applying circuit 38 and may be represented by the electrical equivalent circuit shown in FIG. 7. The total resistance of the jumper cable JC is comprised of a plurality of lesser resistances: the resistance R1 of the surface contact between one clamp CL and the jumper attachment terminal 32; the resistance R2 of the clamp CL itself; the resistance R3 of the ferrule FL; the resistance R4 of the cable CL; the resistance R5 of the other ferrule FL; the resistance R6 of the other clamp CL; and the resistance R7 of the surface contact between the other clamp CL and the other jumper attachment terminal 32. The resistance R1 and R7 of the surface contacts between the clamps CL and the jumper attachment terminals 32 may be determined by contacting the test probes 36 at the test points TP1 and TP7 in FIGS. 6 and 7. This may indicate whether excessive corrosion on the surface of the clamps CL is adversely affecting the resistance of the jumper cable JC. The resistances R2 and R6 of the clamps CL may be determined by contacting the test probes 36 at the test points TP2 and TP6 in FIGS. 6 and 7. This may indicate whether the clamps CL are adversely affecting the resistance of the jumper cable JC. The resistances R3 and R5 of the ferrules FL may be determined by contacting the test probes 36 at the test points TP3 and TP5 in FIGS. 6 and 7. This may indicate whether the ferrules FL are adversely affecting the resistance of the jumper cable JC. Finally, the resistance R4 of the cable CA may be determined by contacting the test probes at the test points TP4 in FIGS. 6 and 7. This may indicate whether the cable CA is adversely affecting the resistance of the jumper cable JC. Once the portions of the jumper cable JC that are adversely affecting its resistance are identified, special attention may be paid to these portions during inspection and maintenance.

It is thought that the present invention and its advantages will be understood from the foregoing description and it will be apparent that various changes may be made thereto without departing from the spirit and scope of the invention or sacrificing all of its material advantages, the form hereinbefore described being merely preferred or exemplary embodiment thereof.

I claim:

1. A method of testing resistance of a protective grounding jumper cable, said testing method comprising the steps of:
   (a) connecting a jumper cable to be tested between a pair of terminals;
   (b) applying a direct current to said pair of terminals so as to cause flow of said direct current through the jumper cable;
   (c) observing a current sensing meter in a circuit connected across said terminals for sensing and indicating the quantity of said direct current flowing through the jumper cable while adjusting said direct current flowing through the jumper cable;
   (d) deciding in response to said observing of said current sensing meter to either
      (i) continue with testing of the jumper cable in accordance with subsequent steps (e) through (h) only if said direct current can be adjusted to a first preselected quantity,
      (ii) retest the jumper cable in accordance with previous and subsequent steps (a) through (h) after inspecting and maintaining the jumper cable, or
      (iii) reject the jumper cable;
   (e) setting a resistance sensing meter to sense resistance within a first preselected test range;
   (f) contacting a pair of test probes connected to said resistance sensing meter with said terminals to sense and indicate on said resistance sensing meter the resistance to the flow of said direct current through the jumper cable;
   (g) comparing the resistance indicated by said resistance sensing meter with said first preselected test range; and
   (h) deciding in response to said comparison of the resistance indicated by said resistance sensing meter with said first preselected test range to either
      (i) accept the jumper cable,
      (ii) retest the jumper cable in accordance with said steps (a) through (h) after inspecting and maintaining the jumper cable, or
      (iii) reject the jumper cable.

2. The method of claim 1, wherein in response to said observation of said current sensing meter, the jumper cable is retested in accordance with said steps (a) through (h) after inspecting and maintaining the jumper cable only if:
   (i) said direct current cannot be adjusted to said first preselected quantity; and
   (ii) the jumper cable has not yet been retested.

3. The method of claim 1, wherein in response to said observation of said current sensing meter, the jumper cable is rejected only if:
   (i) said direct current cannot be adjusted to said first preselected quantity; and
   (ii) the jumper cable has already been inspected and maintained and is presently being retested in accordance with said steps (a) through (h).

4. The method of claim 1, wherein in response to said comparison of the resistance indicated by said resistance sensing meter with said first preselected test range, the jumper cable is accepted only if the resistance is within said first preselected test range and below a predetermined safe resistance level.

5. The method of claim 1, wherein in response to said comparison of the resistance indicated by said resistance sensing meter with said first preselected test range, the jumper cable is retested only if:
   (i) the resistance exceeds a predetermined safe resistance level; and
   (ii) the jumper cable has not yet been inspected, maintained and retested in accordance with said steps (a) through (h).

6. The method of claim 1, wherein in response to said comparison of the resistance indicated by said resistance sensing meter with said first preselected test range, the jumper cable is rejected only if:
   (i) the resistance exceeds a predetermined safe resistance level; and
   (ii) the jumper cable has already been inspected and maintained and is presently being retested in accordance with said steps (a) through (h).

7. The method of claim 1, further comprising the steps of:
   (i) deciding in response to said comparison of the resistance indicated by said resistance sensing meter with said first preselected range to retest the jumper cable in accordance with subsequent steps (j) through (n) because the resistance is below said first preselected test range;
   (j) adjusting said direct current flowing through the jumper cable to a second preselected quantity, said second preselected quantity being greater than said first preselected quantity;
   (k) setting said resistance sensing meter to sense resistance within a second preselected test range, said second preselected test range being lower than said first preselected test range;
   (l) contacting said pair of test probes with said terminals to sense and indicate on said resistance sensing meter the resistance to the flow of said direct current through the jumper cable;
   (m) comparing the resistance indicated by said resistance sensing meter with said second preselected test range; and
   (n) deciding in response to said comparison of the resistance indicated by said resistance sensing meter with said second preselected test range to
      (i) accept the jumper cable,
      (ii) retest the jumper cable in accordance with said steps (a) through (h) after inspecting and maintaining the jumper cable, or
      (iii) reject the jumper cable.

8. The method of claim 7, wherein in response to said comparison of the resistance indicated by said resistance sensing meter with said second preselected test range, the jumper cable is accepted only if the resistance is within said second preselected test range and below said predetermined safe resistance level.

9. The method of claim 7, wherein in response to said comparison of the resistance indicated by said resistance sensing meter with said second preselected test range, the jumper cable is retested only if:

(i) the resistance exceeds said predetermined safe resistance level; and
   (ii) the jumper cable has not yet been inspected, maintained and retested in accordance with said steps (i) through (n).

10. The method of claim 7, wherein in response to said comparison of the resistance indicated by said resistance sensing meter with said second preselected test range, the jumper cable is rejected only if:

(i) the resistance exceeds said predetermined safe resistance level; and
    (ii) the jumper cable has already been inspected and maintained and is presently being retested in accordance with said steps (i) through (n).

11. The method of claim 7, further comprising the steps of:

(o) deciding in response to said comparison of the resistance indicated by said resistance sensing meter with said second preselected range to retest the jumper cable in accordance with subsequent steps (p) through (s) because the resistance is below said second preselected test range;
    (p) setting said resistance sensing meter to sense resistance within a third preselected test range, said third preselected test range being lower than said second preselected test range;
    (q) contacting said pair of test probes with said terminals to sense and indicate on said resistance sensing meter the resistance to the flow of said direct current through the jumper cable;
    (r) comparing the resistance indicated by said resistance sensing meter with said third preselected test range; and
    (s) deciding in response to said comparison of the resistance indicated by said resistance sensing meter with said third preselected test range to
       (i) accept the jumper cable,
       (ii) retest the jumper cable in accordance with said steps (a) through (h) after inspecting and maintaining the jumper cable, or
       (iii) reject the jumper cable.

12. The method of claim 11, wherein in response to said comparison of the resistance indicated by said resistance sensing meter with said third preselected test range, the jumper cable is accepted only if the resistance is below said predetermined safe level.

13. The method of claim 11, wherein in response to said comparison of the resistance indicated by said resistance sensing meter with said third preselected test range, the jumper cable is retested only if:

(i) the resistance exceeds said predetermined safe resistance level; and
    (ii) the jumper cable has not yet been inspected, maintained and retested in accordance with said steps (o) through (s).

14. The method of claim 11, wherein in response to said comparison of the resistance indicated by said resistance sensing meter with said third preselected test range, the jumper cable is rejected only if:

(i) the resistance exceeds said predetermined safe resistance level; and
    (ii) the jumper cable has already been inspected and maintained and is presently being retested in accordance with said steps (o) through (s).

15. The method of claim 11, wherein prior to said step of retesting the jumper cable, inspection of the jumper cable includes identifying portions of the jumper cable having relatively high resistance to the flow of said direct current therethrough by contacting said pair of test probes at various locations on the jumper cable to sense and indicate on said resistance sensing meter the resistance to the flow of said direct current through different portions of the jumper cable.

* * * * *